(12) United States Patent
Nakamoto

(10) Patent No.: US 12,142,971 B2
(45) Date of Patent: Nov. 12, 2024

(54) ELECTRIC POWERED WORK MACHINE

(71) Applicant: MAKITA CORPORATION, Anjo (JP)

(72) Inventor: Akihiro Nakamoto, Anjo (JP)

(73) Assignee: MAKITA CORPORATION, Anjo (JP)

( * ) Notice: Subject to any disclaimer, the term of this patent is extended or adjusted under 35 U.S.C. 154(b) by 453 days.

(21) Appl. No.: 17/624,775

(22) PCT Filed: Jun. 17, 2020

(86) PCT No.: PCT/JP2020/023846
§ 371 (c)(1),
(2) Date: Jan. 4, 2022

(87) PCT Pub. No.: WO2021/005990
PCT Pub. Date: Jan. 14, 2021

(65) Prior Publication Data
US 2022/0247279 A1 Aug. 4, 2022

(30) Foreign Application Priority Data
Jul. 11, 2019 (JP) .................................. 2019-129233

(51) Int. Cl.
H02K 11/28 (2016.01)
B25D 16/00 (2006.01)
H02K 7/14 (2006.01)

(52) U.S. Cl.
CPC ............. *H02K 11/28* (2016.01); *H02K 7/145* (2013.01); *B25D 16/006* (2013.01);
(Continued)

(58) Field of Classification Search
CPC .... H02K 11/28; H02K 7/145; H02K 2211/03; B25D 16/006; B25D 2250/095; B25D 2216/0084; B25D 2250/265
See application file for complete search history.

(56) References Cited

U.S. PATENT DOCUMENTS

2013/0119834 A1* 5/2013 Nakagami ............. H02K 11/05
310/68 D
2016/0020676 A1* 1/2016 Omura ................... H02K 9/227
310/50

(Continued)

FOREIGN PATENT DOCUMENTS

CN 101187364 A 5/2008
CN 103348138 A 10/2013

(Continued)

OTHER PUBLICATIONS

Sep. 15, 2020 International Search Report issued in International Patent Application No. PCT/JP2020/023846.

(Continued)

Primary Examiner — Forrest M Phillips
(74) Attorney, Agent, or Firm — Oliff PLC

(57) ABSTRACT

An electric powered work machine in one aspect of the present disclosure includes a motor, a current-carrying path, a switching circuit, a circuit board, a metal case, and a heat radiation sheet. The circuit board includes a first surface, a second surface, a first hole group, a board conductive line, and a circuit arrangement area.

11 Claims, 9 Drawing Sheets

(52) U.S. Cl.
CPC ............... *B25D 2216/0084* (2013.01); *B25D 2250/095* (2013.01); *B25D 2250/265* (2013.01); *H02K 2211/03* (2013.01)

(56) References Cited

U.S. PATENT DOCUMENTS

| | | |
|---|---|---|
| 2017/0309555 A1 | 10/2017 | Shimakawa et al. |
| 2017/0349206 A1 | 12/2017 | Asao et al. |
| 2017/0366073 A1 | 12/2017 | Hieda et al. |
| 2019/0199175 A1 | 6/2019 | Kanazawa et al. |
| 2020/0139529 A1* | 5/2020 | Habermann ............... B25F 5/00 |

FOREIGN PATENT DOCUMENTS

| | | | |
|---|---|---|---|
| CN | 204913830 U | 12/2015 | |
| CN | 107004647 A | 8/2017 | |
| CN | 107249965 A | 10/2017 | |
| CN | 206595845 U | 10/2017 | |
| CN | 107528428 A | 12/2017 | |
| CN | 109643938 A | 4/2019 | |
| DE | 102021213443 A1 * | 6/2023 | .............. B25F 5/008 |
| EP | 2664419 A2 * | 11/2013 | .............. B25F 5/008 |
| JP | H05-21488 U1 | 3/1993 | |
| JP | H06-252573 A | 9/1994 | |
| JP | 2007-318113 A | 12/2007 | |
| JP | 4992532 B2 | 8/2012 | |
| JP | 2017-132006 A | 8/2017 | |
| JP | 2018-15867 A | 2/2018 | |
| JP | 6328298 B1 | 5/2018 | |
| JP | 6392013 B2 | 9/2018 | |
| WO | WO-2019061084 A1 * | 4/2019 | ........... A01D 34/006 |

OTHER PUBLICATIONS

Apr. 29, 2023 Office Action issued in Chinese Patent Application No. 202080048449.9.

* cited by examiner

ELECTRIC POWERED WORK MACHINE

CROSS-REFERENCE TO RELATED APPLICATION

This international application claims the benefit of Japanese Patent Application No. 2019-129233 filed on Jul. 11, 2019 with the Japan Patent Office, and the entire disclosure of Japanese Patent Application No. 2019-129233 is incorporated herein by reference.

TECHNICAL FIELD

The present disclosure relates to an electric powered work machine.

BACKGROUND ART

An electric powered work machine disclosed in Patent Document 1 indicated below includes a heat radiation sheet that abuts on a semiconductor device and a case, in order to release heat generated in the semiconductor device to an outside of the case. The heat in the semiconductor device is thermally conducted to the case via the heat radiation sheet to cool the semiconductor device.

The semiconductor device has a facing-surface that faces a circuit board, and an opposite-surface on a back of the facing-surface. As the semiconductor device is configured to dissipate heat from the opposite-surface, the heat radiation sheet abuts on the opposite-surface.

PRIOR ART DOCUMENTS

Patent Documents

Patent Document 1: Japanese Unexamined Patent Application Publication No. 2018-015867

SUMMARY OF THE INVENTION

Problems to be Solved by the Invention

However, semiconductor devices are not limited to those that dissipate heat from an opposite-surface, and include those that dissipate heat from a facing-surface.

If the aforementioned electric powered work machine employs such a semiconductor device that dissipates heat from a facing-surface, it is not possible to provide a thermal conduction path from the semiconductor device to the case via the heat radiation sheet in the electric powered work machine. Consequently, the semiconductor device may not be sufficiently cooled.

Accordingly, in one aspect of the present disclosure, it is desirable to cool a semiconductor device that dissipates heat from its facing-surface in an electric powered work machine.

Means for Solving the Problems

An electric powered work machine in one aspect of the present disclosure includes a motor, a current-carrying path, a switching circuit, a circuit board, a metal case, and a heat radiation sheet.

The motor is a driving source for the electric powered work machine. The current-carrying path is electrically connected to the motor. The switching circuit includes a first semiconductor device. The first semiconductor device is provided on the current-carrying path to the motor so as to control a conducted state of the motor. The circuit board includes the switching circuit and a portion of the current-carrying path. The metal case is made of metal, and is fixed to the circuit board. The heat radiation sheet abuts on the circuit board and the metal case.

The circuit board includes a first surface, a second surface, a first hole group, a board conductive line, and a circuit arrangement area. The first surface includes the switching circuit. In other words, the switching circuit is mounted on the first surface. The second surface abuts on the heat radiation sheet. The first hole group includes two or more first through holes. The two or more first through holes penetrate from the first surface to the second surface. The board conductive line includes a conductive material. The board conductive line includes at least the portion of the current-carrying path, and is electrically connected to the switching circuit.

The circuit arrangement area includes the switching circuit and the first hole group. In other words, the first hole group is provided in the arrangement area for the switching circuit in the circuit board.

The board conductive line includes a first conductive line portion, a second conductive line portion, and two or more third conductive line portions. The first conductive line portion is arranged on the first surface of the circuit board. The second conductive line portion is arranged on the second surface of the circuit board. The two or more third conductive line portions are arranged on respective inner surfaces of the two or more first through holes. The first conductive line portion is electrically connected to the second conductive line portion via the two or more third conductive line portions.

In the electric powered work machine, the two or more third conductive line portions of the board conductive line form two or more thermal conduction paths from the first surface to the second surface of the circuit board. In other words, the electric powered work machine includes two or more thermal conduction paths from the switching circuit to the metal case through the board conductive line (specifically, the first conductive line portion, the two or more third conductive line portions, and the second conductive line portion) and the heat radiation sheet. The two or more third conductive line portions contain conductive materials, thus having an excellent thermal conductivity, as compared with that of the circuit board itself.

Thus, since the electric powered work machine includes the two or more thermal conduction paths through the two or more third conductive line portions, the electric powered work machine has an improved thermal conductivity performance from the first surface to the second surface of the circuit board. As a result, heat generated in the first semiconductor device of the switching circuit is efficiently transferred to the metal case through the circuit board. Accordingly, since the electric powered work machine according to the present disclosure includes the thermal conduction paths from the switching circuit to the metal case through the circuit board, the first semiconductor device can be cooled even if the first semiconductor device is configured to dissipate heat from a facing-surface facing the circuit board.

Also, the above-described electric powered work machine may include two or more fillers arranged in respective interiors of the two or more first through holes.

Since the electric powered work machine allows the two or more thermal conduction paths to be provided through the two or more fillers, the thermal conductivity performance from the first surface to the second surface can be improved, as compared with a configuration where the two or more first through holes internally include respective cavities. The two or more fillers may be conductive materials or insulating materials.

Also, the switching circuit of the above-described electric powered work machine may further include a second semiconductor device provided on the current-carrying path to the motor so as to control the conducted state of the motor. The board conductive line may include a first coupling portion electrically connected to the first semiconductor device, to the second semiconductor device, and to the motor. The first semiconductor device and the second semiconductor device may be disposed such that the first coupling portion is arranged therebetween, as seen from a direction perpendicular to a board surface of the circuit board.

In the electric powered work machine, the first semiconductor device, the second semiconductor device, and the first coupling portion are arranged in the above-described manner, which can shorten each of a distance between the first semiconductor device and the first coupling portion and a distance between the second semiconductor device and the first coupling portion, as compared with a configuration where the first semiconductor device, the second semiconductor device, and the first coupling portion are arranged apart from each other. Accordingly, in the electric powered work machine, a footprint of the current-carrying path (board conductive line) in the circuit board can be reduced, thereby facilitating downsizing the circuit board.

Also, the metal case of the above-described electric powered work machine may include a board-facing-surface facing the second surface of the circuit board. Further, the board-facing-surface may include a facing protruding portion projecting toward the circuit board. The heat radiation sheet may abut on the circuit board and the facing protruding portion.

Since the electric powered work machine includes the metal case provided with the facing protruding portion, a distance from the circuit board to the metal case can be shorter, as compared with a metal case having no facing protruding portion. Thus, the thermal conduction paths from the circuit board to the metal case via the heat radiation sheet can be shorter in the electric powered work machine, and a thermal conduction efficiency in the thermal conduction paths can thereby be improved.

Also, the facing protruding portion of the above-described electric powered work machine may include a first protruding portion and a second protruding portion. The first protruding portion may project toward the first semiconductor device. The second protruding portion may project toward the second semiconductor device.

The heat radiation sheet may include a first sheet and a second sheet. The first sheet may be arranged between the first semiconductor device and the first protruding portion. The second sheet may be arranged between the second semiconductor device and the second protruding portion.

According to the electric powered work machine described above, gaps may be formed between the first protruding portion and the second protruding portion, and between the first sheet and the second sheet. The gaps can be used for gaps for arranging components. Examples of the components may include the first coupling portion, a cable connected to the first coupling portion, and the like.

Also, the switching circuit of the above-described electric powered work machine may further include a third semiconductor device provided on the current-carrying path so as to control the conducted state of the motor and a fourth semiconductor device provided on the current-carrying path so as to control the conducted state of the motor. The board conductive line may include a second coupling portion electrically connected to the third semiconductor device, to the fourth semiconductor device, and to the motor.

The third semiconductor device and the fourth semiconductor device may be arranged such that the second coupling portion is arranged therebetween, as seen from a direction perpendicular to the first surface of the circuit board. The circuit board may include a first connection arrangement area and a second connection arrangement area adjacent to each other. The first connection arrangement area may be provided with the first semiconductor device, the first coupling portion, and the second semiconductor device thereon. The second connection arrangement area may be provided with the third semiconductor device, the second coupling portion, and the fourth semiconductor device thereon.

In the circuit board of the electric powered work machine, each of a distance between the third semiconductor device and the second coupling portion, and a distance between the fourth semiconductor device and the second coupling portion can be shorter, similarly to the case of the first semiconductor device, the first coupling portion, and the second semiconductor device.

Further, the current-carrying path (board conductive line) in the circuit board can be shorter in the electric powered work machine, as compared with the case where the first connection arrangement area and the second connection arrangement area are arranged apart from each other. Accordingly, since the footprint of the current-carrying path (board conductive line) in the circuit board can be reduced in the electric powered work machine, the circuit board can be downsized.

Also, in the above-described electric powered work machine, the circuit board may include a second hole group and a device adjacent area. The second hole group may include two or more second through holes penetrating from the first surface to the second surface of the circuit board. The device adjacent area may include a second hole group and may be adjacent to the circuit arrangement area. The board conductive line may include two or more fourth conductive line portions arranged on respective inner surfaces of the two or more second through holes. The first conductive line portion may be electrically connected to the second conductive line portion via the two or more fourth conductive line portions.

As described above, since the two or more fourth conductive line portions are included in the device adjacent area distinct from the circuit arrangement area, more thermal conduction paths from the first surface to the second surface of the circuit board can be ensured, as compared with a case where the two or more third conductive line portions only are included. Thus, the thermal conductivity performance from the first surface to the second surface of the circuit board can be improved in the electric powered work machine, and thus a thermal conductivity in the thermal conduction paths from the switching circuit to the heat radiation sheet through the circuit board can be increased in the electric powered work machine. This enables the heat generated in the switching circuit to be more efficiently transferred to the metal case.

Also, in the above-described electric powered work machine, the second hole group may be arranged in a portion of the device adjacent area. In other words, the circuit board may include, in the device adjacent area, a first adjacent area where the second hole group is formed, and a second adjacent area where the second hole group is not formed.

In such a circuit board, since the second hole group is not arranged in the entire device adjacent area, an additional member can be arranged in the second adjacent area of the device adjacent area (in other words, a surrounding area of the switching circuit). Examples of the additional member include a circuit conductive line provided for electrically connecting different portions in the circuit board to each other.

As described above, according to the electric powered work machine, when an arrangement (for example, a laying route for the circuit conductive line) of the additional member of the circuit board is determined, degrees of freedom in the design of the arrangement of the additional member are increased, since the additional member can be arranged in a large area including the second adjacent area of the device adjacent area.

EXPLANATION OF REFERENCE NUMERALS

1 . . . electric powered work machine, 121 . . . circuit board, 123 . . . case, 123a . . . bottom, 123c . . . board-facing-surface, 123d . . . protruding portion, 123d1 . . . first separated protruding portion, 123d2 . . . second separated protruding portion, 125 . . . heat radiation sheet, 125a . . . first separated heat radiation sheet, 125b . . . second separated heat radiation sheet, 132 . . . board conductive line, 132a . . . first current-carrying electrode, 132b . . . second current-carrying electrode, 132c . . . third current-carrying electrode, 132d . . . first surface conductive line, 132e . . . second surface conductive line, 132f . . . through conductive line, 134 . . . circuit conductive line, 150 . . . through hole, ene 51a . . . first left hole group, 151b . . . first right hole group, 153 . . . second through-hole group, 155 . . . third through-hole group, 157 . . . fourth through-hole group, 159 . . . fifth through-hole group, 161 . . . sixth through-hole group, 163 . . . filler, M1 . . . drive motor, Q1 through Q6 . . . first through sixth switching devices.

MODE FOR CARRYING OUT THE INVENTION

Hereinafter, embodiments to which the present disclosure is applied will be described with reference to the drawings.

It is to be understood that the present disclosure is not limited to the following embodiments, and may include various modes within the technical scope of the present disclosure.

1. First Embodiment

[1-1. Overall Configuration]

Figure 1:
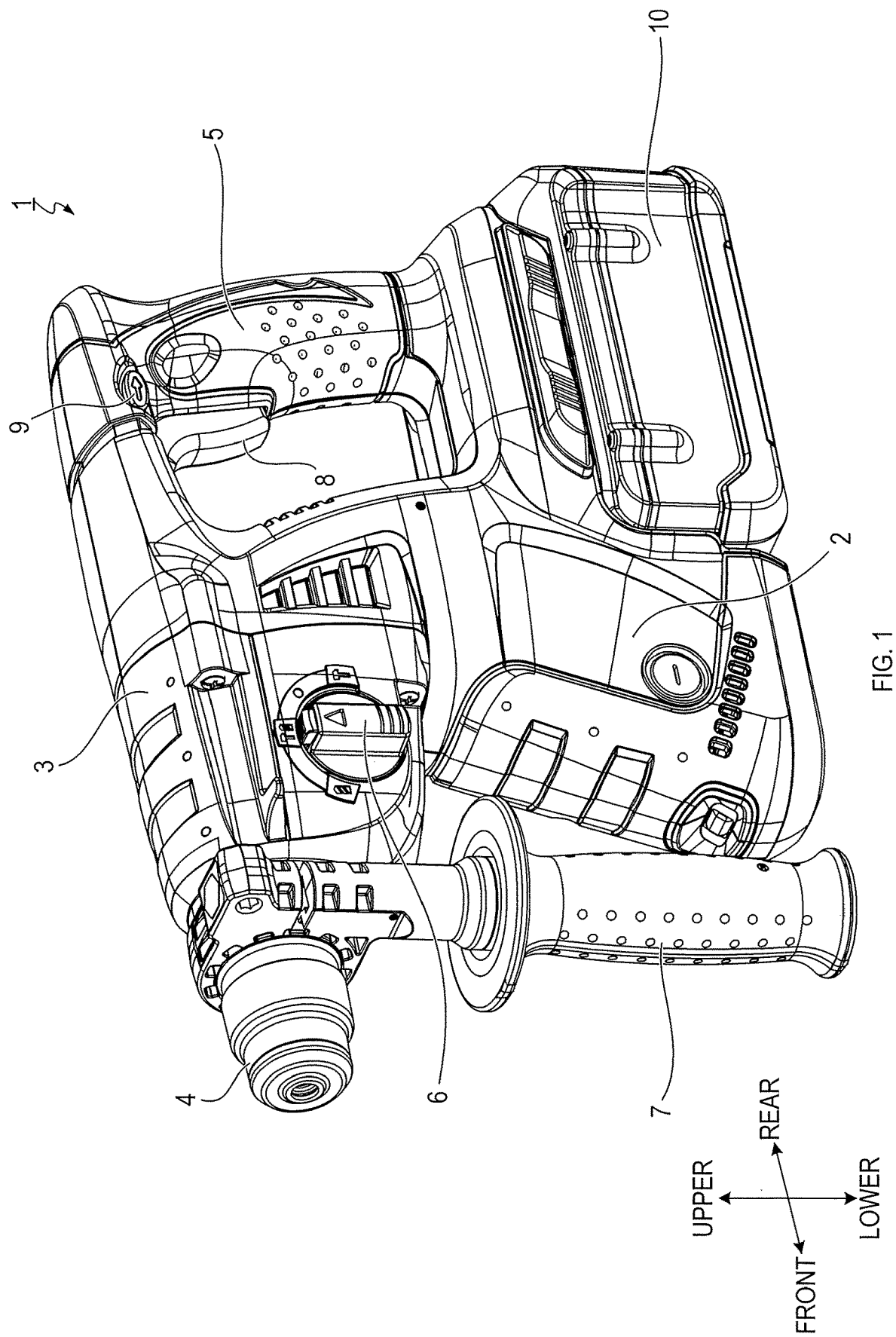
FIG. 1 is a perspective view showing an external appearance of an electric powered work machine according to the present disclosure.

As shown in FIG. 1, an electric powered work machine 1 of the present embodiment is configured as, what is called, an electric hammer drill.

More specifically, the electric powered work machine 1 includes a motor housing 2, a gear housing 3 disposed above the motor housing 2, a drill chuck 4 disposed in front of the gear housing 3, and an operating portion 5 disposed behind the gear housing 3.

The motor housing 2 accommodates therein a drive motor M1 (see FIG. 2) that produces a driving force for rotationally driving the drill chuck 4. The drive motor M1 is a driving source for the electric powered work machine 1. The drive motor M1 is supplied with an electric power to thereby be energized and driven.

The gear housing 3 accommodates therein a gear mechanism (not shown) that transmits the driving force of the drive motor M1 to the drill chuck 4. Further, the gear housing 3 is provided with a mode-changing switch 6 for a user of the electric powered work machine 1 to switch rotational operation modes of the drill chuck 4 (for example, a rotation (or drill) mode, an impact (or hammer) mode, and the like).

The drill chuck 4 includes an attachment mechanism (not shown) at a front end portion of the drill chuck 4. The attachment mechanism receives a tool bit (not shown) detachably attached thereto. Between the drill chuck 4 and the gear housing 3, a rod-shaped grip portion 7 extending downward is disposed. The grip portion 7 is detachably attached to the electric powered work machine 1. The grip portion 7 is formed such that the user can hold the grip portion 7 with one hand.

The operating portion 5 is formed such that the user can hold the operating portion 5 with the other hand. In a front side of the operating portion 5, a trigger switch 8 is disposed for the user to drive/stop the drive motor M1. Further, a rotational direction change switch 9 is disposed in an upper side of the operating portion 5. The rotational direction change switch 9 changes rotational directions (forward direction/reverse direction) of the drive motor M1. Further, a battery pack 10 is detachably attached to the electric powered work machine 1 at a lower end part of the operating portion 5.

[1-2. Electrical Configuration of Electric Powered Work Machine]

Figure 2:
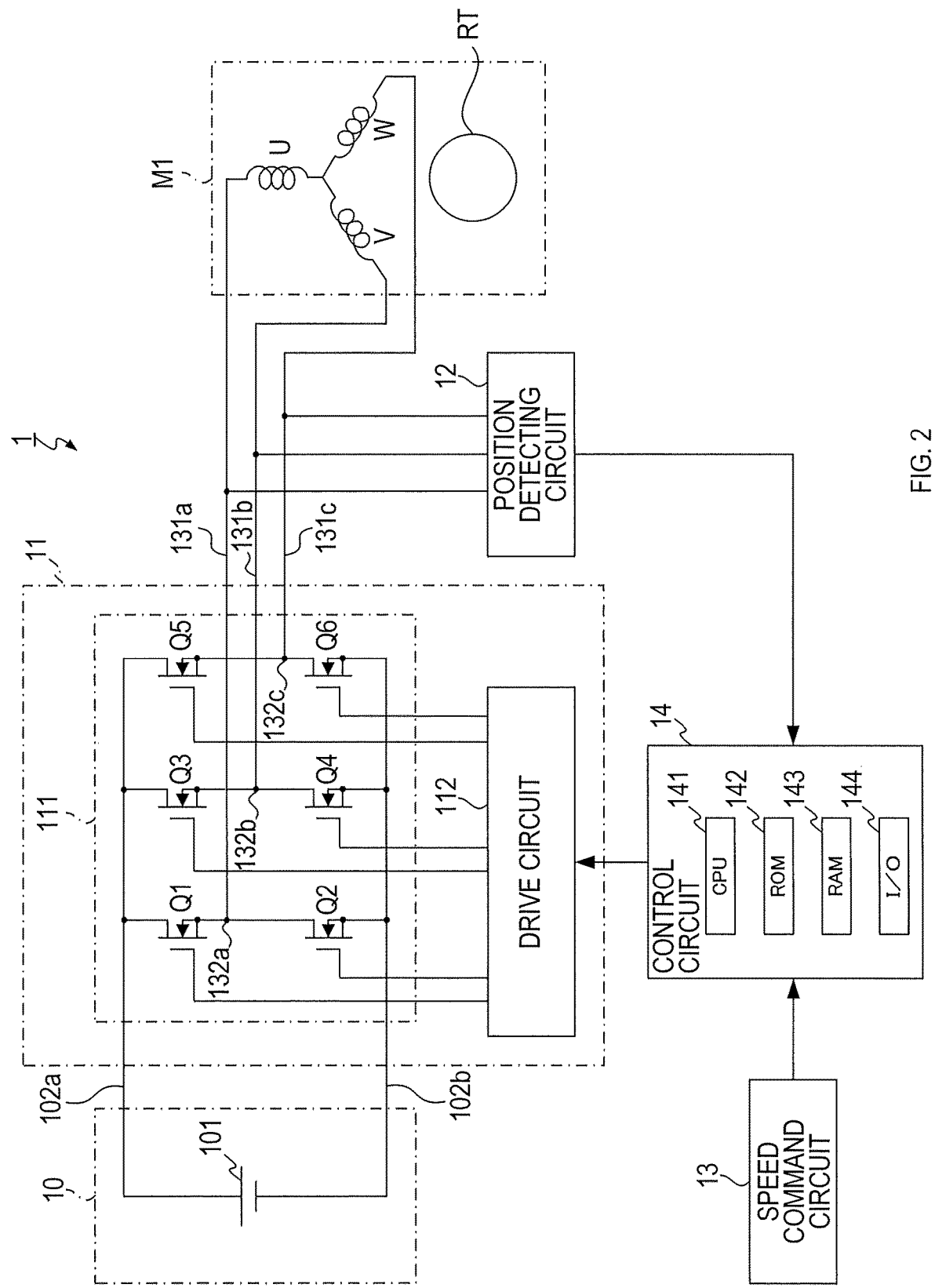
FIG. 2 is a block diagram showing an electrical configuration of the electric powered work machine.

As shown in FIG. 2, the electric powered work machine 1 includes a battery cell 101, the drive motor M1, an inverter circuit 11, a position detection circuit 12, a speed command circuit 13, and a control circuit 14.

The battery cell 101 is represented as one cell in FIG. 2, but includes two or more cells coupled in series.

The drive motor M1 is configured as a well-known brushless direct-current (DC) motor. More specifically, the drive motor M1 includes a rotor RT having two or more permanent magnets (for example, two permanent magnets), which are not shown, and three coils U, V, and W for rotating the rotor RT. Each of the coils U, V, and W is connected to one another at one end thereof (in other words, in the form of Y-connection). That is, the drive motor M1 is a three-phase brushless DC motor. It is to be noted that, although the rotor RT is shown outside the coils U, V, and W in FIG. 2, FIG. 2 simply illustrates an electrical connection relation, not a structural arrangement.

The drive motor M1 of the present embodiment is an inner-rotor type brushless DC motor, in which the rotor RT is disposed within the coils U, V, and W. Also, the drive motor M1 of the present embodiment is configured as, what is called, a sensorless motor, and does not include a sensor (for example, a Hall element, or the like) for directly detecting a rotational position of the rotor RT. The drive motor M1 is not limited to the sensorless motor, and may include a sensor (for example, a Hall element, or the like) for directly detecting a rotational position of the rotor RT.

The inverter circuit 11 includes a switching circuit 111 and a drive circuit 112.

The switching circuit 111 is electrically connected to the battery cell 101 via a first battery conductive line 102a and a second battery conductive line 102b. The switching circuit 111 is electrically connected to the drive motor M1 via three motor connecting conductive lines (a first motor connecting conductive line 131a, a second motor connecting conductive line 131b, and a third motor connecting conductive line 131c). The switching circuit 111 is configured to turn ON/OFF a power supply path from the battery cell 101 to the coils U, V, and W in the drive motor M1. The first battery conductive line 102a, the second battery conductive line 102b, the first motor connecting conductive line 131a, the second motor connecting conductive line 131b, and the third motor connecting conductive line 131c form a current-carrying path from the battery cell 101 to the drive motor M1.

More specifically, the switching circuit 111 includes first through sixth switching devices Q1 through Q6. Each of the first through sixth switching devices Q1 through Q6 is a well-known Power Metal-Oxide-Semiconductor Field-Effect Transistor (power MOSFET). The power MOSFET is a MOSFET designed to handle large electric current, and generates heat associated with an energization control. The power MOSFET of the present embodiment includes a facing-surface and an opposite-surface. The facing-surface faces a circuit board. The opposite-surface is on a back of the facing-surface. The power MOSFET is configured to dissipate heat from the facing-surface, not from the opposite-surface, when the power MOSFET is mounted on the circuit board.

Further, a pair of the first and second switching devices Q1 and Q2 coupled in series, a pair of the third and the fourth switching devices Q3 and Q4 coupled in series, and a pair of the fifth and the sixth switching devices Q5 and Q6 coupled in series are coupled in parallel between a positive electrode and a negative electrode of the battery cell 101. The first through sixth switching devices Q1 through Q6 are disposed on the current-carrying path to the drive motor M1, and control a conducted state of the drive motor M1.

The coil U of the drive motor M1 is connected, via the first motor connecting conductive line 131a, to a first current-carrying electrode 132a disposed between the first and second switching devices Q1 and Q2. The coil V of the drive motor M1 is connected, via the second motor connecting conductive line 131b, to a second current-carrying electrode 132b disposed between the third and fourth switching devices Q3 and Q4. The coil W of the drive motor M1 is connected, via the third motor connecting conductive line 131c, to a third current-carrying electrode 132c disposed between the fifth and sixth switching devices Q5 and Q6.

The drive circuit 112 is configured to output, to gates of the first through sixth switching devices Q1 through Q6, two or more PWM signals each having a duty ratio corresponding to an operated amount signal to be inputted from the control circuit 14.

The position detecting circuit 12 is configured to, when the rotor RT of the driving motor M1 is rotated, detect a rotational position of the rotor based on an electromotive force induced on each of the coils U, V, and W, and to output rotational position signals indicating the rotational position, to the control circuit 14.

The speed command circuit 13 is configured to output, to the control circuit 14, a desired speed signal indicating a desired value (desired speed) for the rotational speed of the driving motor M1 in accordance with an operated amount of the trigger switch 8.

The control circuit 14 is configured as a microcomputer, and includes at least a CPU 141, a ROM 142, a RAM 143, and an input/output (I/O) interface 144. In the control circuit 14, the CPU 141 executes various processes based on various programs stored in the ROM 142 to control each part of the electric powered work machine 1.

[1-3. Mechanical Configuration of Inverter Circuit]

A mechanical configuration of the inverter circuit 11 will be described.

Figure 3:
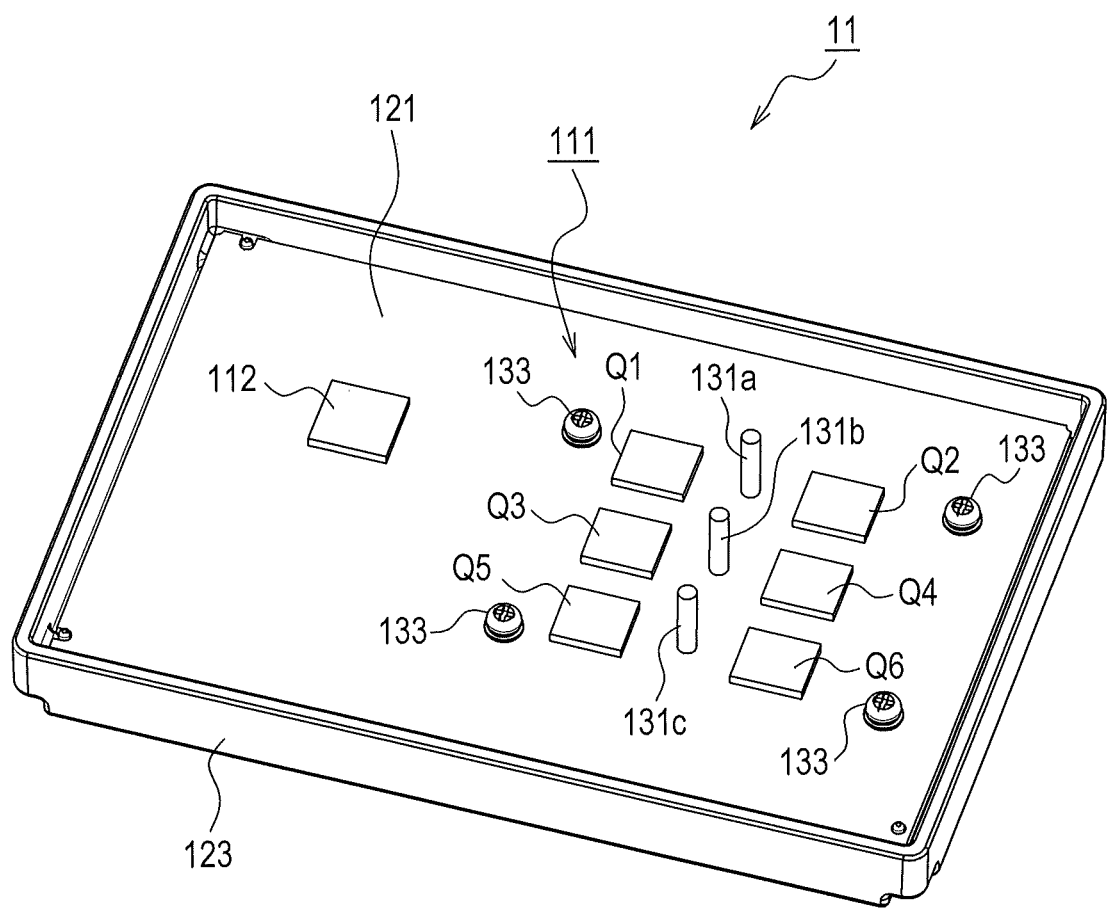
FIG. 3 is a perspective view showing an external appearance of an inverter circuit that includes a circuit board, a case, and heat radiation sheets.
Figure 3:
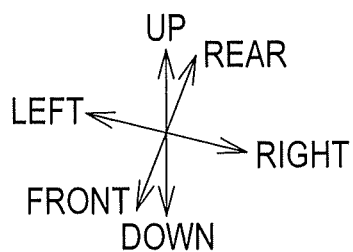
Figure 4:
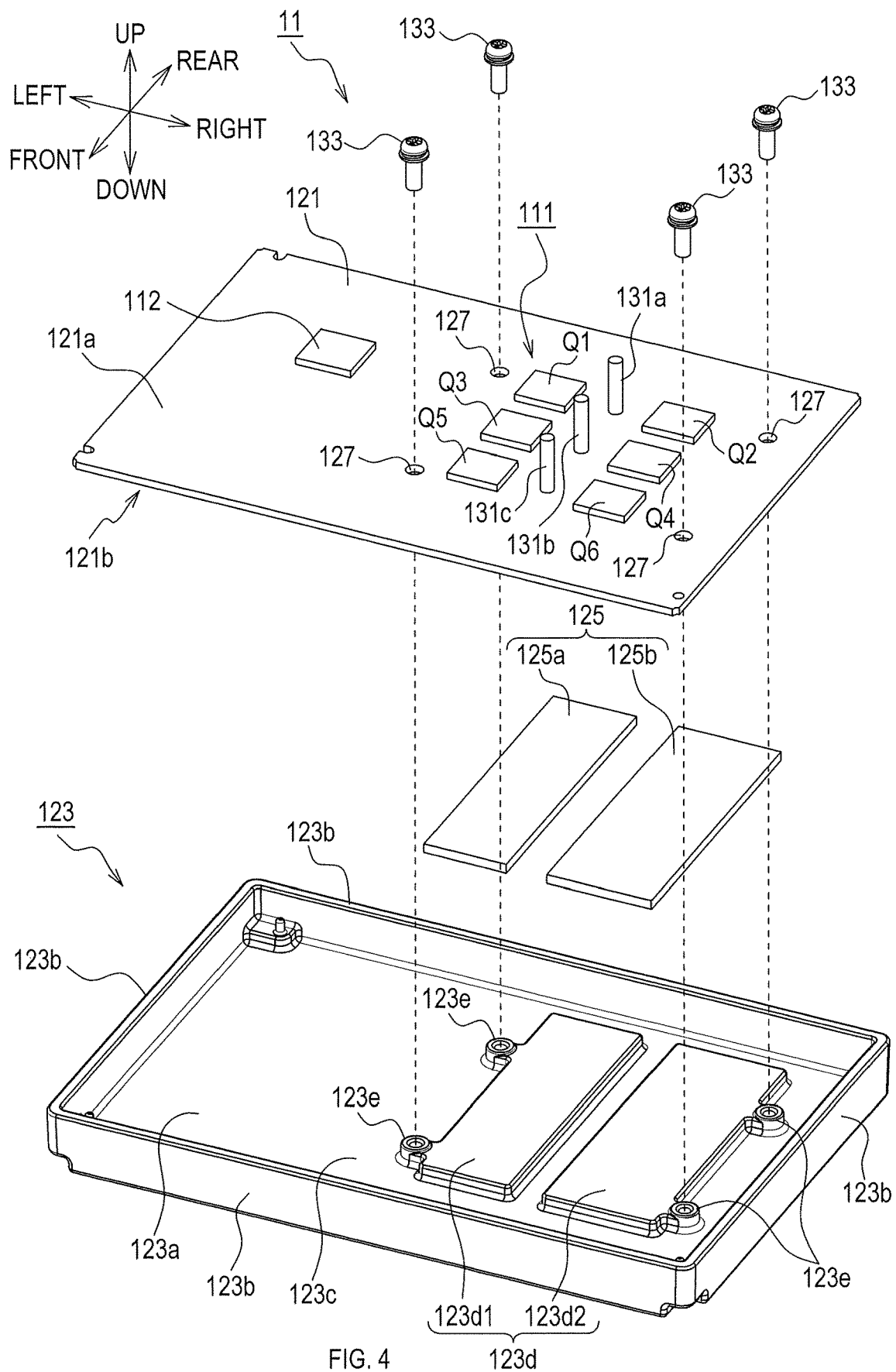
FIG. 4 is an exploded perspective view of the inverter circuit that includes the circuit board, the case, and the heat radiation sheets.

As shown in FIG. 3 and FIG. 4, the inverter circuit 11 includes a circuit board 121, a metal case 123, and a heat radiation sheet 125.

In the following explanation, an up/down direction, a left/right direction, and a front/rear direction are the corresponding directions indicated by arrows in FIG. 3 and FIG. 4.

The circuit board 121 forms a portion of the current-carrying path to the motor, and is a circuit board with various electronic components and the like mounted thereon. On the circuit board 121, at least the first through sixth switching devices Q1 through Q6 and the drive circuit 112 are mounted.

The circuit board 121 is electrically connected to one end portion of the first motor connecting conductive line 131a, one end portion of the second motor connecting conductive line 131b, and one end portion of the third motor connecting conductive line 131c. As described above, the first motor connecting conductive line 131a is connected to the coil U of the drive motor M1. The second motor connecting conductive line 131b is connected to the coil V of the drive motor M1. The third motor connecting conductive line 131c is connected to the coil W of the drive motor M1.

The circuit board 121 has a first surface 121a where the first through sixth switching devices Q1 through Q6 are mounted, and a second surface 121b abutting on the heat radiation sheet 125.

It is to be noted that additional components other than the first through sixth switching devices Q1 through Q6 and the drive circuit 112 are mounted on the circuit board 121. However, representation of the additional components is omitted in FIG. 3 and FIG. 4. Examples of the additional components include an electric device such as a resistive element or a transistor, a connecting terminal connected to a connecting cable, and the like.

The circuit board 121 includes four fixation holes 127. The fixation holes 127 are sized to permit fixation screws 133 to penetrate therethrough. The fixation screws 133 are screws for fixing the circuit board 121 to the metal case 123.

The metal case 123 is a metal housing, to which the circuit board 121 is fixed. The metal case 123 contains aluminum. The metal case 123 may contain other kinds of metals, for example, iron, copper, or the like. In the following description, the metal case 123 is also simply referred to as "case 123".

The case 123 includes a bottom 123a and side wall portions 123b. The bottom 123a is a rectangular portion of the case 123 provided so as to face the second surface 121b of the circuit board 121. The side wall portions 123b are portions of the case 123 extending upwardly from an outer peripheral edge portion of the bottom 123a.

The bottom 123a includes a board-facing-surface 123c and a protruding portion 123d. The board-facing-surface 123c faces the second surface 121b of the circuit board 121. The protruding portion 123d includes a first separated protruding portion 123d1 and a second separated protruding portion 123d2. The first separated protruding portion 123d1 and the second separated protruding portion 123d2 each are individual sections of the board-facing-surface 123c, each of which protrudes toward the circuit board 121.

The first separated protruding portion 123d1 is formed in a position corresponding to the first, third, and fifth switching devices Q1, Q3, and Q5 in the circuit board 121 when the circuit board 121 is fixed to the case 123. The second separated protruding portion 123d2 is formed in a position corresponding to the second, fourth, and sixth switching devices Q 2, Q4, and Q6 in the circuit board 121 when the circuit board 121 is fixed to the case 123.

The case 123 includes four screw holes 123e. The screw holes 123e are formed on the bottom 123a. The four screw holes 123e are configured such that the four fixation screws 133 can be screwed into the four screw holes 123e. The fixation screws 133 and the screw holes 123e are provided for fixing the circuit board 121 to the case 123 with the fixation screws 133 being penetrated through the respective fixation holes 127.

The heat radiation sheet 125 contains an insulating and thermal conductive material (for example, silicone, or the like). The heat radiation sheet 125 abuts on the circuit board 121 and the case 123. The heat radiation sheet 125 includes a first separated heat radiation sheet 125a and a second separated heat radiation sheet 125b. The first separated heat radiation sheet 125a and the second separated heat radiation sheet 125b are each formed in a plate-shape.

Next, arrangement areas for the first through sixth switching devices Q1 through Q6 in the circuit board 121 will be described. In the following description, the arrangement areas for the first through sixth switching devices Q1 through Q6 in the circuit board 121 are also referred to as first through sixth arrangement areas AR1 through AR6.

Figure 5:
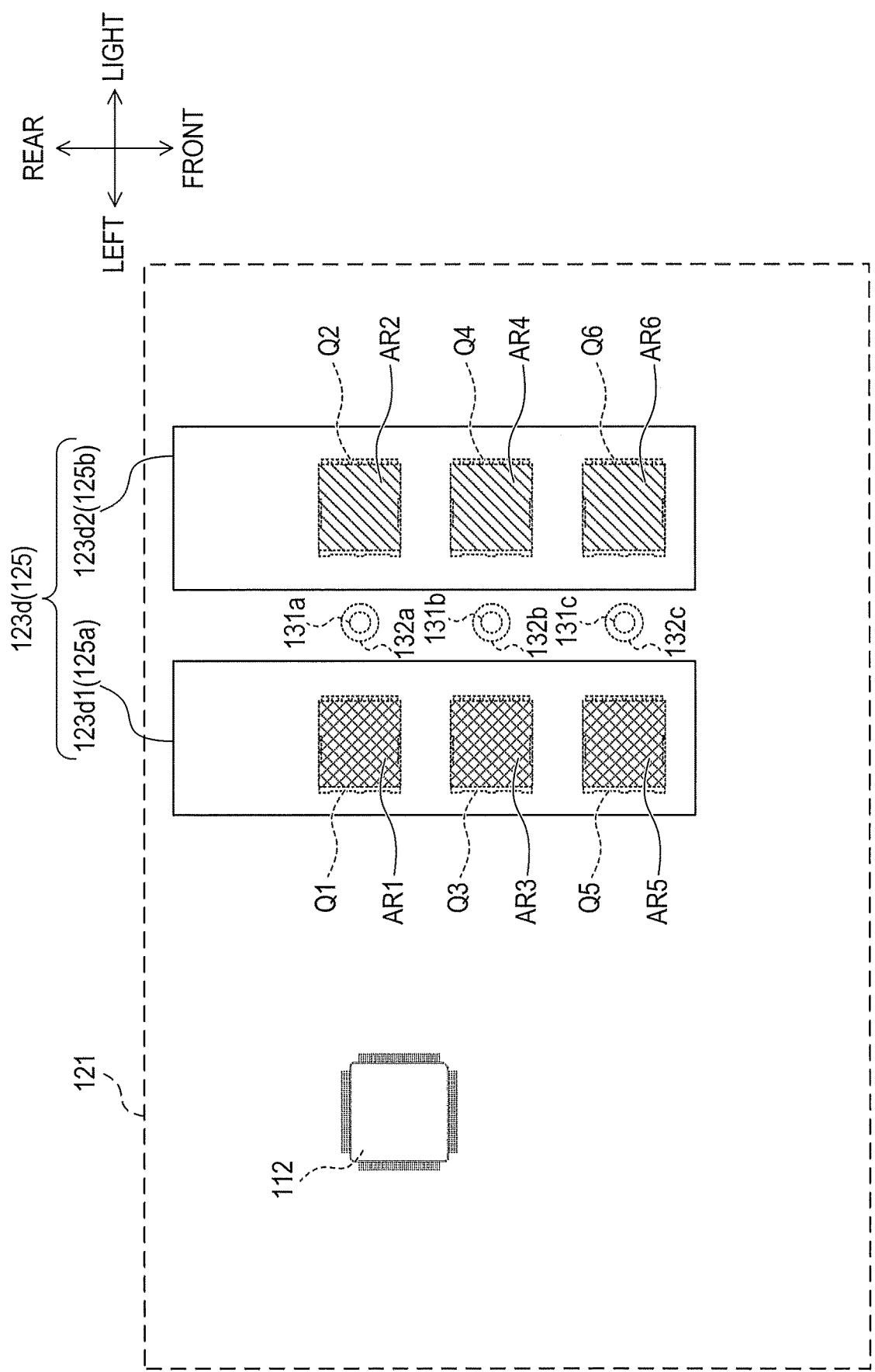
FIG. 5 is a plan view schematically representing a relative position of a first arrangement area through a sixth arrangement area, protruding portions, and the heat radiation sheets.

As schematically shown in FIG. 5, as seen from a direction perpendicular to the first surface 121a of the circuit board 121, the first arrangement area AR1 and the second arrangement area AR2 are arranged such that the first current-carrying electrode 132a is arranged therebetween. Similarly, the third arrangement area AR3 and the fourth arrangement area AR4 are arranged such that the second current-carrying electrode 132b is arranged therebetween. The fifth arrangement area AR5 and the sixth arrangement area AR6 are arranged such that the third current-carrying electrode 132c is arranged therebetween.

The circuit board 121 includes a board conductive line 132 (see FIG. 8, FIG. 9, and other figures, which will be described below). The board conductive line 132 is a conductive line provided on the circuit board 121, and contains a conductive material (for example, copper, or the like). For example, the board conductive line 132 forms a portion of the current-carrying path leading to the drive motor M1 from the battery pack 10 via the first through sixth switching devices Q1 through Q6. The board conductive line 132 forms a portion of the current-carrying path to the electric device, the connecting terminal, or the like that is mounted on the circuit board 121. The board conductive line 132 forms a portion of a signal path leading to the drive circuit 112.

The first current-carrying electrode 132a is a portion of the board conductive line 132, which is electrically connected to the first motor connecting conductive line 131a. The second current-carrying electrode 132b is a portion of the board conductive line 132, which is electrically connected to the second motor connecting conductive line 131b. The third current-carrying electrode 132c is a portion of the board conductive line 132, which is electrically connected to the third motor connecting conductive line 131c.

Also, a relative position of the arrangement areas for the first through sixth switching devices Q1 through Q6 on the circuit board 121, the protruding portion 123d, and the heat radiation sheet 125 will be described.

As seen from the direction perpendicular to the first surface 121a of the circuit board 121 under the situation where the circuit board 121 is fixed to the case 123, the first separated protruding portion 123d1 is formed so as to encompass the first arrangement area AR1, the third arrangement area AR3, and the fifth arrangement area AR5. Similarly, the second separated protruding portion 123d2 is formed so as to encompass the second arrangement area AR2, the fourth arrangement area AR4, the sixth arrangement area AR6. In other words, the protruding portion 123d is formed so as to encompass the first arrangement area AR1 to the sixth arrangement area AR6.

The first separated heat radiation sheet 125a is formed so as to be equivalent to the first separated protruding portion 123d1 in size. The second separated heat radiation sheet 125b is formed so as to be equivalent to the second separated protruding portion 123d2 in size. That is, the first separated heat radiation sheet 125a is arranged between the circuit board 121 and the case 123 so as to encompass the first arrangement area AR1, the third arrangement area AR3, and the fifth arrangement area AR5. The second separated heat radiation sheet 125b is arranged between the circuit board 121 and the case 123 so as to encompass the second arrangement area AR2, the fourth arrangement area AR4, and the sixth arrangement area AR6. That is, the heat radiation sheet 125 is arranged between the circuit board 121 and the case 123 so as to encompass the first arrangement area AR1 to the sixth arrangement area AR6.

Next, procedures for fixing the circuit board 121 to the case 123 will be described.

When the circuit board 121 is fixed to the case 123, the heat radiation sheet 125 is first arranged on the protruding portion 123d. Specifically, the first separated heat radiation sheet 125a is arranged on the first separated protruding portion 123d1, and the second separated heat radiation sheet 125b is arranged on the second separated protruding portion 123d2.

The circuit board 121 is then arranged in an interior of the case 123 such that the circuit board 121 is superposed on the heat radiation sheet 125. Next, the fixation screws 133 penetrated through the respective fixation holes 127 are screwed into the respective screw holes 123e. The circuit board 121 is thereby fixed to the case 123 via the four fixation screws 133.

It is to be noted that a tightening torque of each of the fixation screws 133 is a magnitude to permit a shrink of the heat radiation sheet 125 interposed between the circuit board 121 and the case 123 (in particular, the protruding portion 123d). For example, the tightening torque is a magnitude to reduce a thickness dimension of the heat radiation sheet 125 from 0.75 mm in a free state to 0.50 mm. The heat radiation sheet 125 is shrunk in this manner such that the thickness dimension thereof is decreased, and thus a thermal resistance in the heat radiation sheet 125 can be reduced. This enables an increase in a thermal conduction efficiency from the circuit board 121 to the case 123.

Figure 6:
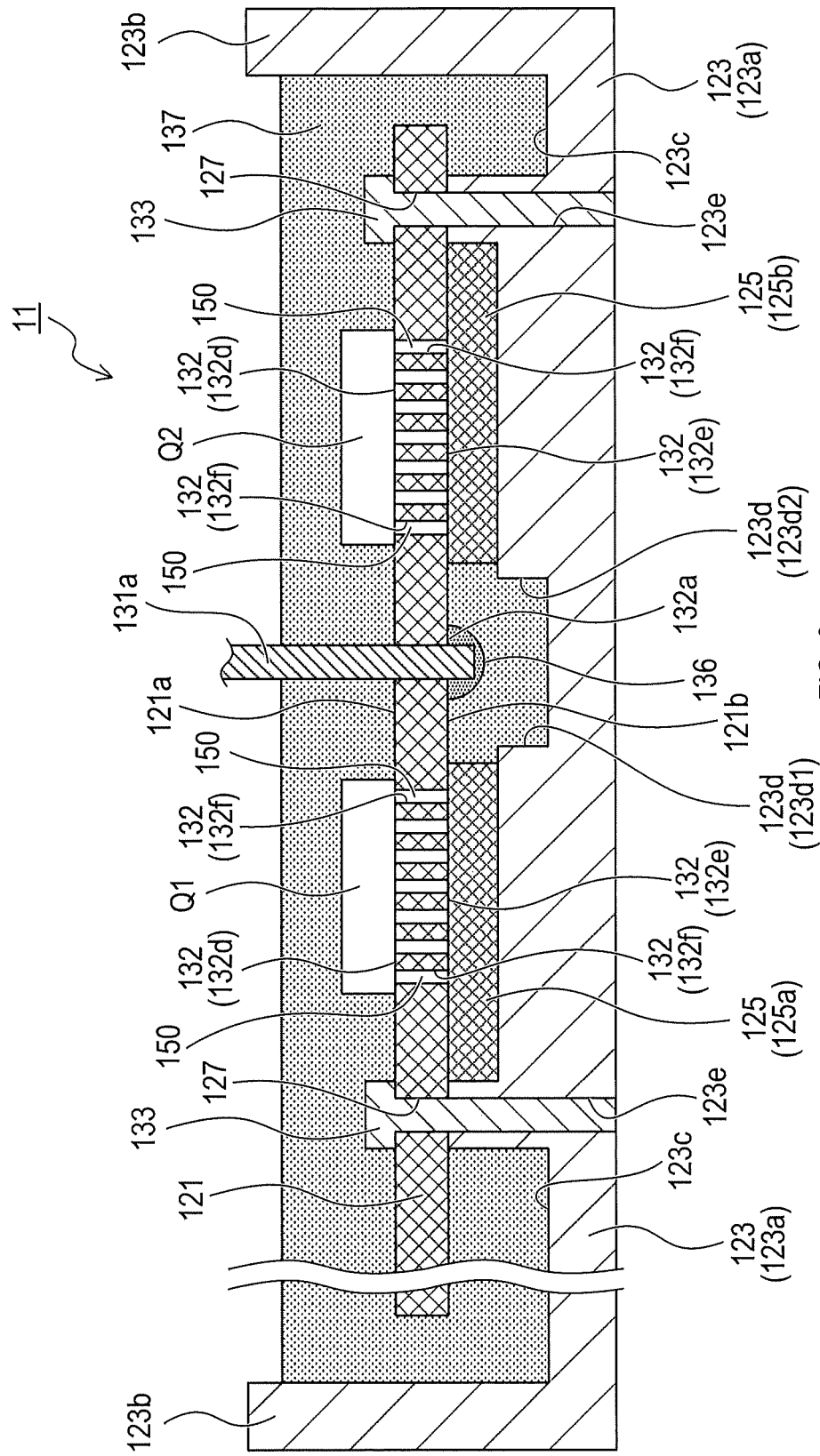
FIG. 6 is a cross-sectional view schematically representing an internal configuration of the inverter circuit including the circuit board, the case, and the heat radiation sheet.

After the circuit board 121 is fixed to the case 123 as described above, as shown in FIG. 6, the interior of the case 123 is filled with a mold material 137 such that the mold material 137 covers a periphery of the circuit board 121. The filling of the mold material 137 in the interior of the case 123 causes the circuit board 121 to be firmly fixed to the interior of the case 123. The mold material 137 contains an insulating material (for example, polyurethane resin, epoxy resin, and the like). FIG. 6 is a schematic cross-sectional diagram showing an internal configuration of a portion where the first switching device Q1 and second switching device Q2 are arranged, of the inverter circuit 11 that includes the circuit board 121, the case 123, and the heat radiation sheet 125.

The protruding portion 123d is configured to be separated into the first separated protruding portion 123d1 and the second separated protruding portion 123d2. This configuration enables the case 123 to have a space between the first separated protruding portion 123d1 and the second separated protruding portion 123d2 for arranging the respective one end portions of the first motor connecting conductive line 131a, the second motor connecting conductive line 131b, and the third motor connecting conductive line 131c.

In a state where the respective one end portions of the first motor connecting conductive line 131a, the second motor connecting conductive line 131b, and the third motor connecting conductive line 131c penetrate from the first surface 121a to the second surface 121b of the circuit board 121, the respective one end portions of the first motor connecting conductive line 131a, the second motor connecting conductive line 131b, and the third motor connecting conductive line 131c are electrically connected respectively to the first current-carrying electrode 132a, the second current-carrying electrode 132b, and the third current-carrying electrode 132c on the second surface 121b via a solder 136.

[1-4. Configuration of Circuit Board]

Next, a configuration of the circuit board 121 will be described.

Figure 7:
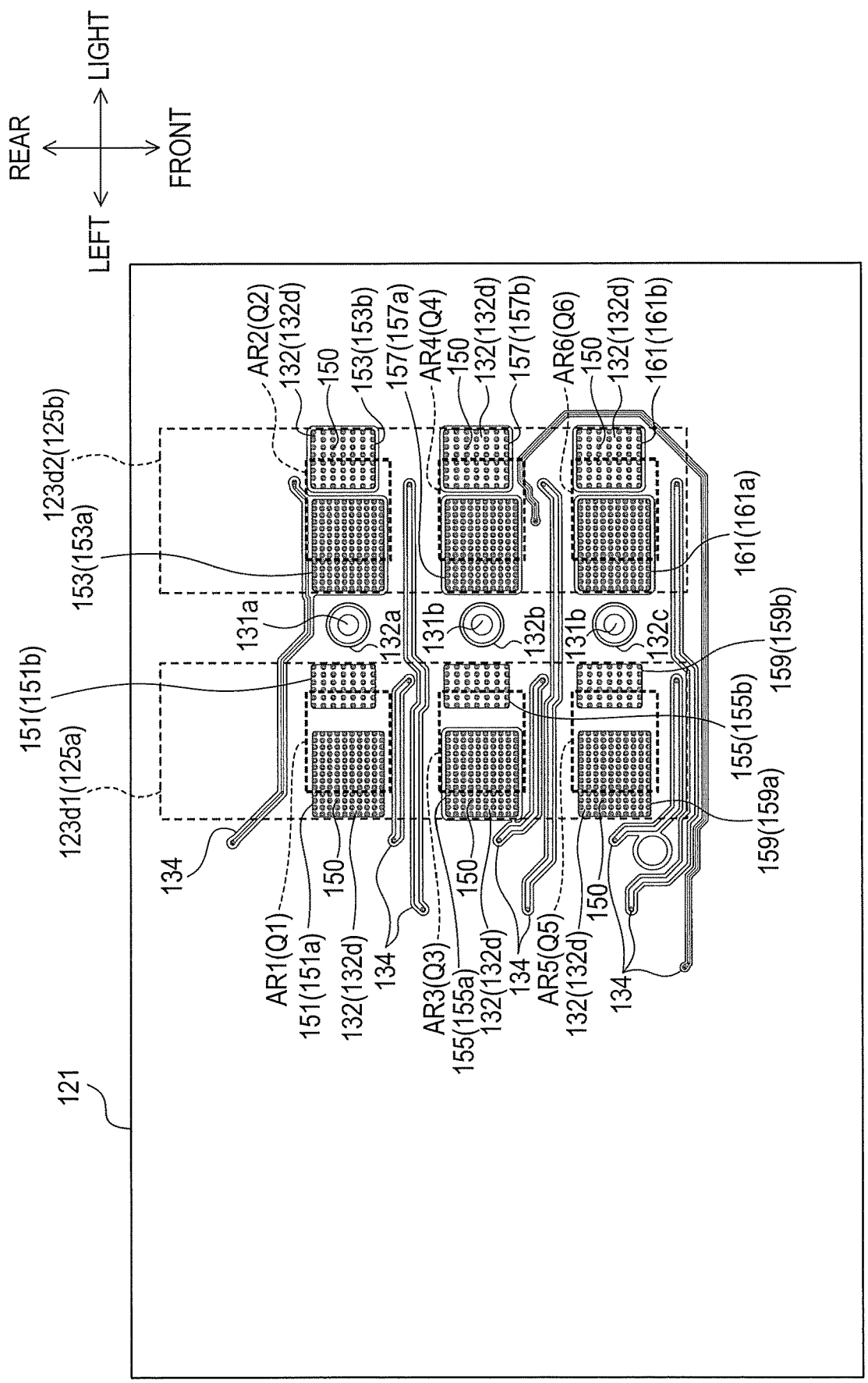
FIG. 7 is a plan view schematically representing a relative position of the first arrangement area through the sixth arrangement area, arrangement areas for through holes, and protruding portions in the circuit board.
Figure 8:
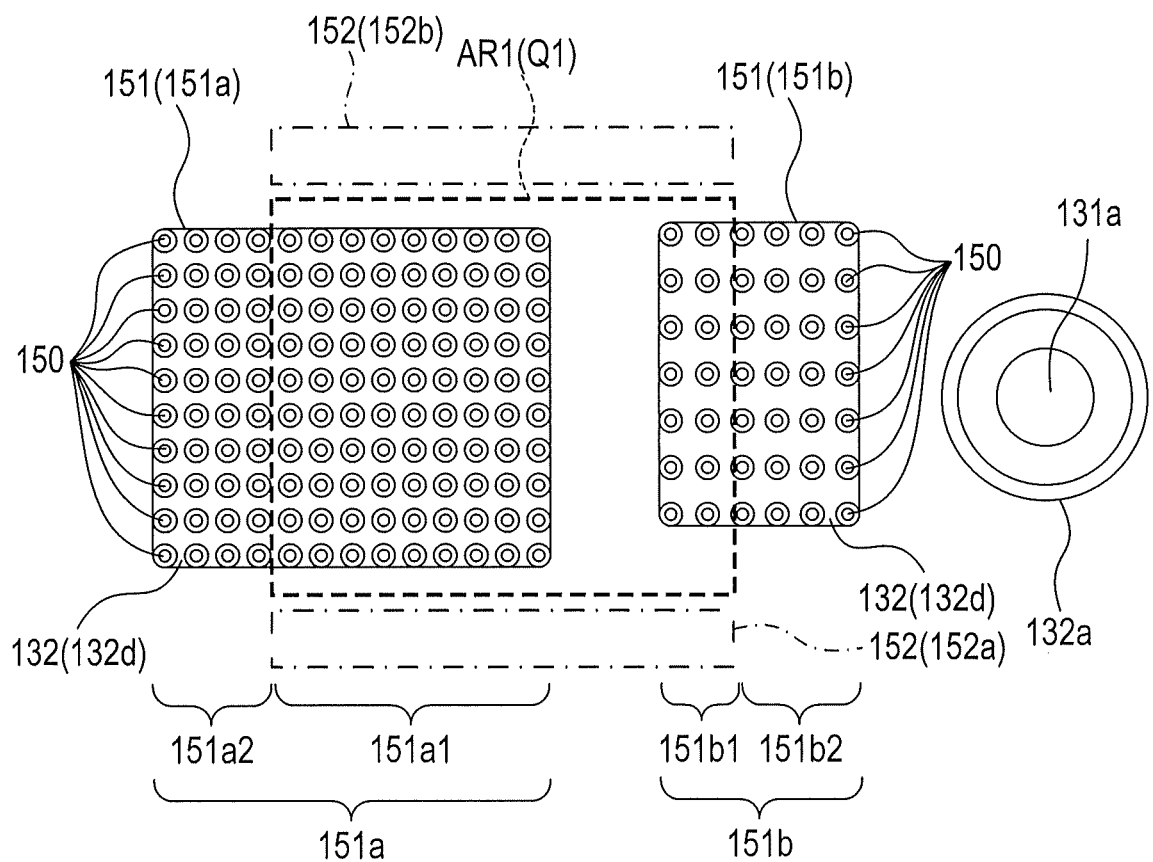
FIG. 8 is an explanatory diagram schematically representing the first arrangement area and a first through-hole group.
Figure 9:
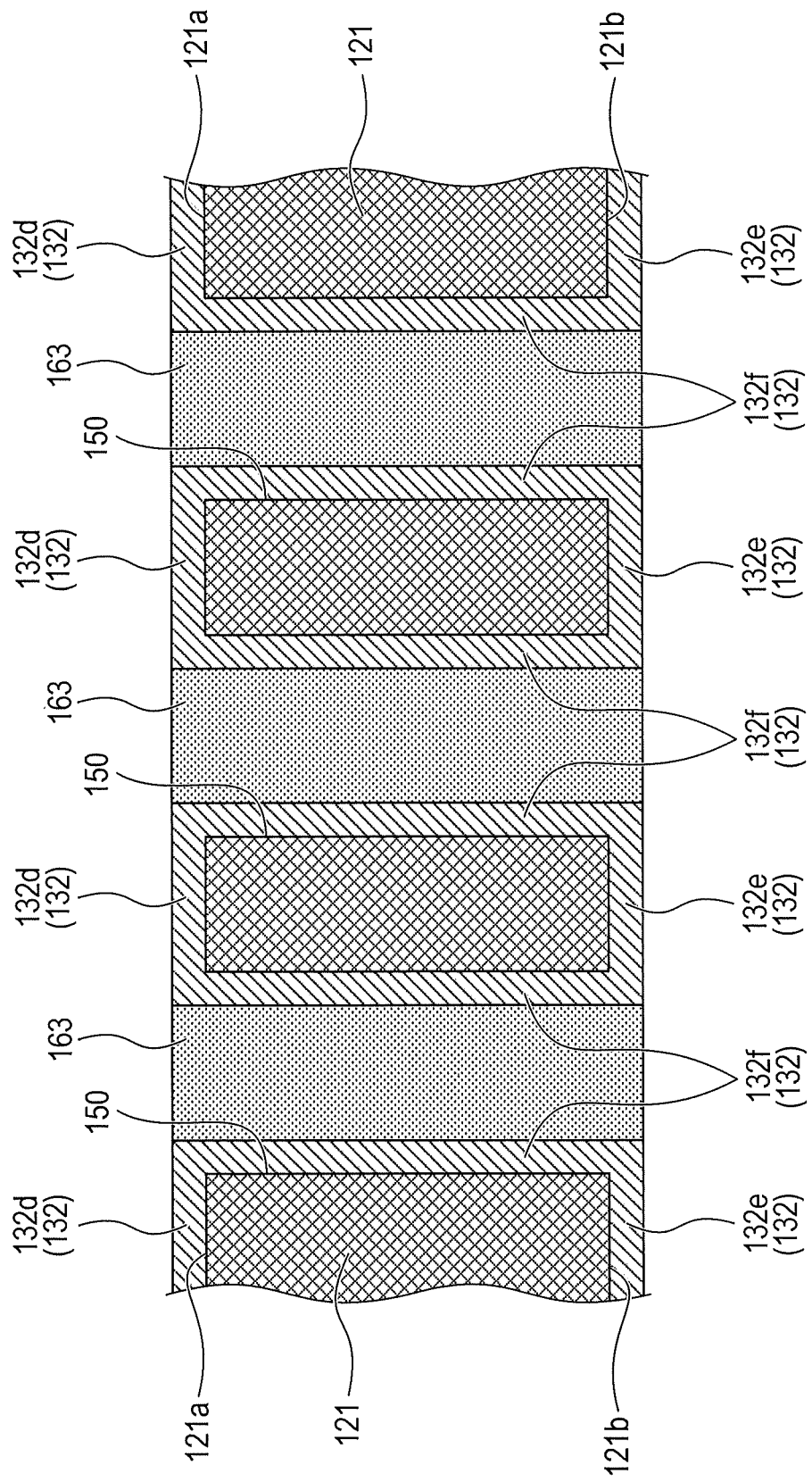
FIG. 9 is a schematic cross-sectional diagram representing a cross-section of a formation area for the first through-hole group in the circuit board.

As shown in FIG. 7, FIG. 8, and FIG. 9, the circuit board 121 includes the board conductive line 132 and two or more through holes 150.

The board conductive line 132 is electrically connected to the first through sixth switching devices Q1 through Q6, and electrically connected to the drive motor M1 via the first through third motor connecting conductive lines 131a through 131c.

Each of the two or more through holes 150 is a through hole penetrating from the first surface 121a to the second surface 121b.

The circuit board 121 includes through-hole groups having the two or more through holes 150. The circuit board 121 includes a first through-hole group 151, a second through-hole group 153, a third through-hole group 155, a fourth through-hole group 157, a fifth through-hole group 159, and a sixth through-hole group 161.

The first through-hole group 151 includes a first left hole group 151a and a first right hole group 151b. Each group of the first left hole group 151a and the first right hole group 151b includes the two or more through holes 150.

Similarly, the second through-hole group 153 includes a second left hole group 153a and a second right hole group 153b. The third through-hole group 155 includes a third left hole group 155a and a third right hole group 155b. The fourth through-hole group 157 includes a fourth left hole group 157a and a fourth right hole group 157b. The fifth through-hole group 159 includes a fifth left hole group 159a and a fifth right hole group 159b. The sixth through-hole group 161 includes a sixth left hole group 161a and a sixth right hole group 161b.

As seen from the direction perpendicular to the first surface 121a of the circuit board 121, the first through-hole group 151 has a portion overlapping the first arrangement area AR1. In other words, each group of the first left hole group 151a and the first right hole group 151b is formed at a position where the portion overlapping the first arrangement area AR1 is situated.

As shown in an enlarged view in FIG. 8, the first left hole group 151a includes an overlap area 151a1 and an adjacent area 151a2. The overlap area 151a1 is an area of the first left hole group 151a, which is overlapped with the first arrangement area AR1. The adjacent area 151a2 is an area of the first left hole group 151a, which is not overlapped with the first arrangement area AR1. In addition, the adjacent area 151a2 is an area adjacent to the first arrangement area AR1.

The first right hole group 151b includes an overlap area 151b1 and an adjacent area 151b2. The overlap area 151b1 is an area of the first right hole group 151b, which is overlapped with the first arrangement area AR1. The adjacent area 151b2 is an area of the first right hole group 151b, which is not overlapped with the first arrangement area AR1. In addition, the adjacent area 151b2 is an area adjacent to the first arrangement area AR1.

As shown in FIG. 7, similarly to the first through-hole group 151, the second through-hole group 153 (in particular, the second left hole group 153a and the second right hole group 153b) includes a portion overlapping the second arrangement area AR2. The third through-hole group 155 (in particular, the third left hole group 155a and the third right hole group 155b) includes a portion overlapping the third arrangement area AR3. The fourth through-hole group 157 (in particular, the fourth left hole group 157a and the fourth right hole group 157b) includes a portion overlapping the fourth arrangement area AR4. The fifth through-hole group 159 (in particular, the fifth left hole group 159a and the fifth right hole group 159b) includes a portion overlapping the fifth arrangement area AR5. The sixth through-hole group 161 (in particular, the sixth left hole group 161a and the sixth right hole group 161b) includes a portion overlapping the sixth arrangement area AR6.

As shown in FIG. 7, as seen from the direction perpendicular to the first surface 121a of the circuit board 121 under the situation where the circuit board 121 is fixed to the case 123, the first separated protruding portion 123d1 (represented by dotted lines in FIG. 7) encompasses the first through-hole group 151, the third through-hole group 155, and the fifth through-hole group 159. As described above, the first separated protruding portion 123d1 encompasses the first arrangement area AR1, the third arrangement area AR3, and the fifth arrangement area AR5.

Thus, respective heat generated in the first, third, and fifth switching devices Q1, Q3, and Q5, is thermally conducted to the first separated heat radiation sheet 125a via the first through-hole group 151, the third through-hole group 155, and the fifth through-hole group 159, respectively. Further, this heat is thermally conducted from the first separated heat radiation sheet 125a to the first separated protruding portion 123d1, thereby to be thermally conducted to the case 123.

Similarly, the second separated protruding portion 123d2 (represented by dotted lines in FIG. 7) encompasses the second through-hole group 153, the fourth through-hole group 157, and the sixth through-hole group 161. As described above, the second separated protruding portion 123d2 encompasses the second arrangement area AR2, the fourth arrangement area AR4, and the sixth arrangement area AR6. Thus, respective heat generated in the second, fourth, and sixth switching devices Q2, Q4, and Q6 is thermally conducted to the second separated heat radiation sheet 125b via the second through-hole group 153, the fourth through-hole group 157, and the sixth through-hole group 161, respectively. Further, this heat is thermally conducted from the second separated heat radiation sheet 125b to the second separated protruding portion 123d2, thereby to be thermally conducted to the case 123.

As shown in an enlarged view in FIG. 9, the board conductive line 132 includes a first surface conductive line 132d, a second surface conductive line 132e, and two or more through conductive lines 132f. The first surface conductive line 132d is a conductive line formed on the first surface 121a of the circuit board 121. The second surface conductive line 132e is a conductive line formed on the second surface 121b of the circuit board 121. The two or more through conductive lines 132f are conductive lines formed on the respective inner surfaces of the respective through holes 150.

The first surface conductive line 132d and the second surface conductive line 132e are electrically connected to each other via the two or more through conductive lines 132f.

The first surface conductive line 132d, the second surface conductive line 132e, and the two or more through conductive lines 132f are formed in respective areas of the first through-hole group 151, the second through-hole group 153, the third through-hole group 155, the fourth through-hole group 157, the fifth through-hole group 159, and the sixth through-hole group 161. In other words, each of the first through sixth through-hole groups 151 through 161 is provided with the first surface conductive line 132d, the second surface conductive line 132e, and the two or more through conductive lines 132f.

The first surface conductive line 132d and the second surface conductive line 132e of the first through-hole group 151 are formed in the respective areas of the first left hole group 151a and the first right hole group 151b. The same applies to the second through sixth through-hole groups 153 through 161.

The two or more through holes 150 have respective interiors where the two or more through conductive lines 132f are formed and two or more fillers 163 are filled. The two or more fillers 163 contain an electrical insulating material (for example, silica, epoxy resin, or the like). It is to be noted that each of the two or more fillers 163 may contain the same conductive material (for example, copper) as that of the board conductive line 132.

As shown in FIG. 7, the circuit board 121 includes two or more circuit conductive lines 134, in addition to the board conductive line 132. Each of the two or more circuit conductive lines 134 is a conductive line laid for electrically connecting different portions of the circuit board 121 to each other. The two or more circuit conductive lines 134 contain conductive materials.

The circuit board 121 includes a surrounding area of the first arrangement area AR1. The surrounding area of the first arrangement area AR1 includes a first adjacent area and a second adjacent area 152 (see FIG. 8). The first adjacent area includes a right area and a left area of the first arrangement area AR1. Specifically, the first adjacent area includes a portion of the first through-hole group 151 (in particular, the adjacent area 151a2 and the adjacent area 151b2). The second adjacent area 152 includes a front area 152a (see FIG. 8) and a rear area 152b (see FIG. 8) of the first arrangement area AR1. The second adjacent area 152 does not include a through-hole group (in other words, the two or more through holes 150). The circuit conductive lines 134 are arranged in the second adjacent area 152 (the front area 152a and the rear area 152b).

Not only the surrounding area of the first arrangement area AR1, but also respective surrounding areas of the second through sixth arrangement areas AR2 through AR6 include the first adjacent areas and second adjacent areas. Similarly, in each surrounding area of the second through sixth arrangement areas AR2 through AR6, the circuit conductive lines 134 are arranged in the corresponding second adjacent areas (the front areas and the rear areas).

[1-5. Effect]

As described above, the electric powered work machine 1 of the present embodiment includes the first through sixth switching devices Q1 through Q6, the circuit board 121, the case 123, and the heat radiation sheet 125.

In the electric powered work machine 1, the two or more through conductive lines 132f of the board conductive line 132 form thermal conduction paths from the first surface 121a to the second surface 121b of the circuit board 121. That is, the electric powered work machine 1 includes the thermal conduction paths from the first through sixth switching devices Q1 through Q6 to the case 123 through the board conductive line 132 (in particular, the first surface conductive line 132d, the two or more through conductive lines 132f, the second surface conductive line 132e), and the heat radiation sheet 125. The two or more through conductive lines 132f contain conductive materials, thus having an excellent thermal conductivity, as compared with that of the circuit board 121 itself.

Thus, since the electric powered work machine 1 includes the two or more thermal conduction paths through the two or more through conductive lines 132f, the electric powered work machine 1 has an improved thermal conductivity performance from the first surface 121a to the second surface 121b of the circuit board 121. As a result, the heat generated in the first through sixth switching devices Q1 through Q6 is efficiently transferred to the case 123 through the circuit board 121.

Accordingly, the electric powered work machine 1 includes the thermal conduction paths from the first through sixth switching devices Q1 through Q6 to the case 123 through the circuit board 121, and thus can cool the first through sixth switching devices Q1 through Q6 configured to dissipate heat from the facing-surface.

Also, the electric powered work machine 1 includes the two or more fillers 163 arranged in respective interiors of the through holes 150. This configuration enables the electric powered work machine 1 to include the thermal conduction paths through the two or more fillers 163, thereby improving the thermal conductivity performance from the first surface 121a to the second surface 121b, as compared with a configuration where each of the two or more through holes 150 internally includes a cavity.

Also, in the electric powered work machine 1, as seen from the direction perpendicular to the board surface of the circuit board 121, the first arrangement area AR1 and the second arrangement area AR2 are disposed such that the first current-carrying electrode 132a is arranged therebetween. In other words, as seen from the direction perpendicular to the board surface of the circuit board 121, the first switching device Q1 and the second switching device Q2 are disposed such that the first current-carrying electrode 132a is arranged therebetween.

Since the first switching device Q1, the second switching device Q2, and the first current-carrying electrode 132a are arranged in the above-described manner, each of a distance between the first switching device Q1 and the first current-carrying electrode 132a, and a distance between the second switching device Q2 and the first current-carrying electrode 132a can be shorter, as compared with a configuration where the first switching device Q1, the second switching device Q2, and the first current-carrying electrode 132a are arranged apart from each other. Accordingly, since a footprint of the current-carrying path (board conductive line 132) on the circuit board 121 can be reduced in the electric powered work machine 1, the circuit board 121 can thereby be reduced in size.

Similarly, the third arrangement area AR3 and the fourth arrangement area AR4 are disposed such that the second current-carrying electrode 132b is arranged therebetween. Thus, each of a distance between the third switching device Q3 and the second current-carrying electrode 132b and a distance between the fourth switching device Q4 and the second current-carrying electrode 132b can be shorter. This enables reduction in the circuit board 121 in size. Further, the fifth arrangement area AR5 and the sixth arrangement area AR6 are disposed so as to arrange the third current-carrying electrode 132c therebetween. Thus, each of a distance between the fifth switching device Q5 and the third current-carrying electrode 132c and a distance between the sixth switching device Q6 and the third current-carrying electrode 132c can be shorter. This enables reduction in the circuit board 121 in size.

Also, in the electric powered work machine 1, the case 123 includes the protruding portion 123d protruding from the board-facing-surface 123c toward the circuit board 121. The heat radiation sheet 125 abuts on the circuit board 121 and the protruding portion 123d.

Since the electric powered work machine 1 includes the case 123 provided with the protruding portion 123d, a distance from the circuit board 121 to the case 123 can be shorter, as compared with the case 123 having no protruding portion. Thus, the thermal conduction paths from the circuit board 121 to the case 123 through the heat radiation sheet 125 can be shorter in the electric powered work machine 1, and a thermal conduction efficiency in the thermal conduction paths can thereby be improved.

Also, in the electric powered work machine 1, the protruding portion 123d includes the first separated protruding portion 123d1 and the second separated protruding portion 123d2, and the heat radiation sheet 125 includes the first separated heat radiation sheet 125a and the second separated heat radiation sheet 125b.

According to the electric powered work machine 1, a gap can be formed between the first separated protruding portion 123d1 and the second separated protruding portion 123d2, and a gap can be formed between the first separated heat radiation sheet 125a and the second separated heat radiation sheet 125b. These gaps can be used for arranging respective one end portions of the first through third motor connecting conductive lines 131a through 131c. This allows for an efficient use for an internal space of the case 123, thereby reducing the case 123 in size.

Also, the circuit board 121 includes a first connection arrangement area and a second connection arrangement area that are adjacent to each other. The first connection arrangement area includes "an arrangement area for the first switching device Q1, the first current-carrying electrode 132a, and the second switching device Q2". The second connection arrangement area includes "an arrangement area for the third switching device Q3, the second current-carrying electrode 132b, and the fourth switching device Q4".

In the electric powered work machine 1, the current-carrying path (board conductive line 132) in the circuit board 121 can be shorter, as compared with the case where these two arrangements areas are arranged apart from each other. Accordingly, since the footprint of the current-carrying path (board conductive line 132) in the circuit board 121 can be reduced in the electric powered work machine 1, the circuit board 121 can be reduced in size.

Further, in the electric powered work machine 1, "an arrangement area for the fifth switching device Q5, the third current-carrying electrode 132c, and the sixth switching device Q6" are arranged adjacent to "an arrangement area for the third switching device Q3, the second current-carrying electrode 132b, and the fourth switching device Q4".

In the electric powered work machine 1, the current-carrying path (board conductive line 132) in the circuit board 121 can be shorter, as compared with a case where these three arrangements areas separated from each other. Accordingly, the footprint of the current-carrying path (board conductive line 132) in the circuit board 121 can be shortened, and the circuit board 121 can be thereby reduced in size.

Also, the circuit board 121 includes the overlap area 151a1 and the adjacent area 151a2 of the first left hole group 151a, and also includes the overlap area 151b1 and the adjacent area 151b2 of the first right hole group 151b. In other words, the circuit board 121 includes the two or more through holes 150 and the two or more through conductive lines 132f in an area (the overlap area 151a1 and the overlap area 151b1) where the first arrangement area AR1 overlaps. Also, the circuit board 121 includes the two or more through holes 150 (corresponding to two or more second through holes) and the two or more through conductive lines 132f (corresponding to two or more fourth conductive line portions) in an area (the adjacent area 151a2 and the adjacent area 151b2) where the first arrangement area AR1 does not overlap.

As described above, the through conductive lines 132f (corresponding to the two or more fourth conductive line portions) are disposed in the area (the adjacent area 151a2 and the adjacent area 151b2, and corresponding to a device adjacent area) that is distinct from the first arrangement area AR1. As a result, more thermal conduction paths from the first surface 121a to the second surface 121b can be ensured in the circuit board 12, as compared with a case where the through conductive lines 132f are disposed only in the area (the overlap area 151a1, the overlap area 151b1) overlapped with the first arrangement area AR1.

Thus, the thermal conductivity performance from the first surface 121a to the second surface 121b of the circuit board 121 can be improved in the electric powered work machine 1, and thus a thermal conductivity in the thermal conduction paths from the first switching device Q1 to the heat radiation sheet 125 through the circuit board 121 can be increased. This enables the heat generated in the first switching device Q1 to be more efficiently transferred to the case 123.

Also, the circuit board 121 is configured such that a portion of the first through-hole group 151 (in particular, the adjacent area 151a2, the adjacent area 151b2) is arranged in the first adjacent area (right area and left area) of the surrounding area of the first arrangement area AR1, and the through-hole group (in other words, the two or more through holes 150) is not arranged in the second adjacent area (the front area 152a and the rear area 152b) of the surrounding area of the first arrangement area AR1. This allows the circuit conductive lines 134 and the like to be arranged in the second adjacent area (the front area 152a and the rear area 152b) of the surrounding area of the first arrangement area AR1.

Not only the surrounding area of the first arrangement area AR1, but also each surrounding area of the second through sixth arrangement areas AR2 through AR6 allows the circuit conductive lines 134 and the like to be arranged in the corresponding second adjacent areas (front area and rear area).

Accordingly, when a laying route for the circuit conductive lines 134 on the circuit board 121 is determined, degrees of freedom in the design of the laying route are increased. This is because the circuit conductive lines 134 can be laid on a larger area including each second adjacent area (front area and rear area) of the corresponding surrounding areas of the first arrangement area AR1 through the sixth arrangement area AR6.

[1-6. Correspondence Between Terms]

Next, correspondence between terms will be described.

The first battery conductive line 102a, the second battery conductive line 102b, the first motor connecting conductive line 131a, the second motor connecting conductive line 131b, and the third motor connecting conductive line 131c correspond to the current-carrying path to the motor in the present disclosure. The first through sixth switching devices Q1 through Q6 correspond to one example of a switching circuit in the present disclosure.

The two or more through holes 150 formed in the overlap area 151a1 and the overlap area 151b1 correspond to one example of two or more first through holes in the present disclosure. A portion of the first through-hole group 151 that corresponds to the overlap area 151a1 and the overlap area 151b1 corresponds to one example of a first hole group in the present disclosure. The two or more through conductive lines 132f formed in the overlap area 151a1 and the overlap area 151b1 corresponds to one example of two or more third conductive line portions in the present disclosure.

The first switching device Q1 corresponds to one example of a first semiconductor device in the present disclosure. The second switching device Q2 corresponds to one example of a second semiconductor device in the present disclosure. The first current-carrying electrode 132a corresponds to one example of a first coupling portion in the present disclosure.

The protruding portion 123d corresponds to one example of a facing protruding portion in the present disclosure. The first separated protruding portion 123d1 corresponds to one example of a first protruding portion in the present disclosure. The second separated protruding portion 123d2 corresponds to one example of a second protruding portion in the present disclosure. The first separated heat radiation sheet 125a corresponds to one example of a first sheet in the present disclosure. The second separated heat radiation sheet 125b corresponds to one example of a second sheet in the present disclosure.

The third switching device Q3 corresponds to one example of a third semiconductor device in the present disclosure. The fourth switching device Q4 corresponds to one example of a fourth semiconductor device in the present disclosure. The second current-carrying electrode 132b corresponds to one example of a second coupling portion in the present disclosure.

The two or more through holes 150 formed in the adjacent area 151a2 and the adjacent area 151b2 correspond to one example of the two or more second through holes in the present disclosure. A portion of the first through-hole group 151, which corresponds to the adjacent area 151a2 and the adjacent area 151b2, corresponds to one example of a second hole group in the present disclosure. The first arrangement area AR1 corresponds to one example of a circuit arrangement area in the present disclosure. The surrounding area of the first arrangement area AR1 corresponds to one example of a device adjacent area in the present disclosure. The adjacent area 151a2 and the adjacent area 151b2 correspond to one example of a first adjacent area of the device adjacent area in the present disclosure. The two or more through conductive lines 132f formed in the adjacent area 151a2 and the adjacent area 151b2 correspond to one example of two or more fourth conductive line portions in the present disclosure.

The second adjacent area 152 (the front area 152a and the rear area 152b) in the surrounding area of the first arrangement area AR1 corresponds to one example of a second adjacent area in the present disclosure.

2. Other Embodiments

Although embodiments of the present disclosure have been described above, the present disclosure is not limited to the embodiments described above, and can be implemented in various forms without departing from the spirits of the present disclosure.

(2a) The aforementioned embodiments describe a configuration of the first through sixth switching devices Q1 through Q6 mounted on the circuit board, but the number of the semiconductor devices mounted on a circuit board is not limited to the aforementioned number. For example, if the motor is a single-phase direct-current motor, the electric powered work machine may be configured to include one semiconductor device. Alternatively, two semiconductor devices may be included in accordance with a configuration of the motor. The present disclosure is applicable to electric powered work machines including any number of semiconductor devices.

(2b) The aforementioned embodiments describe a configuration of the case including the facing protruding portion (protruding portion 123d), but the case may be configured to include no facing protruding portion. Further, the aforementioned embodiments describe a configuration of the facing protruding portion including two protruding portions (the first separated protruding portion 123d1 and the second separated protruding portion 123d2), but the present disclosure is not limited to such configuration. For example, the facing protruding portion may include one protruding portion solely, or the facing protruding portion may include three or more protruding portions.

Further, the aforementioned embodiments describe a configuration of the case having one protruding portion that encompasses the two or more semiconductor devices (specifically, the first, third, fifth switching devices Q1, Q3, Q5), but the case is not limited to such configuration. For example, the case may be configured to include one protruding portion corresponding to one semiconductor device.

(2c) The aforementioned embodiments describe a configuration of the heat radiation sheet including two sheets, but the present disclosure is not limited to such configuration. For example, the heat radiation sheet may be formed of only one sheet. In this instance, if the case includes one protruding portion, one heat radiation sheet may be shaped in conformity to that protruding portion. Alternatively, if the case includes two or more protruding portions, one heat radiation sheet may be shaped to cover all the two or more protruding portions.

Further, the heat radiation sheet may be configured to include three or more sheets. In this instance, if the case includes one protruding portion, the three or more sheets may be arranged on the one protruding portion. Alternatively, if the case includes three or more protruding portions, the number of sheets may correspond to the number of protruding portions such that the sheet and the protruding portion can have one-to-one relation.

(2d) The aforementioned embodiments describe a configuration of the protruding portion (in other words, the first separated protruding portion 123d1 and the second separated protruding portion 123d2) and heat radiation sheet (in other words, the first separated heat radiation sheet 125a, the second separated heat radiation sheet 125b) having a quadrangular shape (rectangular shape), but the present disclosure is not limited to such configuration. For example, as long as the protruding portion and the heat radiation sheet are shaped to encompass the switching circuit, the protruding portion and the heat radiation sheet may have any shape, such as circular, polygonal, or oval.

(2e) The aforementioned embodiments describe a configuration of the circuit board including through holes not only in the arrangement area (for example, the overlap area 151a1, the overlap area 151b1) for the switching circuit, but also in the device adjacent area (the adjacent area 151a2, the adjacent area 151b2) distinct from the arrangement area for the switching circuit, as a circuit board; however, the present disclosure is not limited to such configuration. For example, the circuit board may be configured to include through holes only in the arrangement area for the switching circuit, and include no through hole in the device adjacent area.

(2f) The aforementioned embodiments describe a configuration of the second hole group provided in each of the right area and the left area of the surrounding areas of the arrangement area (for example, the first arrangement area AR1, and the like) for the switching circuit, but the present disclosure is not limited to such configuration. For example, the second hole group may be provided in each of the front area and the rear area of the surrounding areas of the arrangement area for the switching circuit. Alternatively, the second hole group may be provided only any one of the surrounding areas (right area, left area, front area, rear area) of the arrangement area for the switching circuit. Alternatively, the second hole group may be provided in each of three areas of the surrounding areas (right area, left area, front area, rear area) of the arrangement area for the switching circuit.

The circuit board may be configured such that no second hole group is provided in any one of the surrounding areas (right area, left area, front area, rear area) of the arrangement area for the switching circuit. This allows the circuit conductive line to be laid on an area where the second hole group is not provided, thereby to ensure a larger area of the circuit board for laying the circuit conductive line. Thus, degrees of freedom in the design of the laying route for the circuit conductive line are increased.

(2g) The electric working machine to which the present disclosure can be applied is not limited to an electric hammer drill, and may include, for example, an electric screwdriver, an electric hammer, an electric drill, an electric driver, an electric wrench, an electric reciprocating saw, an electric jigsaw, an electric cutter, an electric chainsaw, an electric planer, an electric tacker, an electric nailer, an electric hedge trimmer, an electric lawn mower, an electric lawn trimmer, an electric bush cutter, an electric cleaner, an electric blower, an electric grinder, an electric impact driver, an electric circular saw, and an electric hammer driver.

(2h) The functions of one component in the above embodiments may be dispersed as two or more components, or the functions of two or more components may be integrated to one component. Further, at least some configurations of the above embodiments may be replaced with a known configuration having the similar function. Furthermore, some configurations of the above embodiments may be omitted. Moreover, at least some configurations of the above embodiments may be added to or replaced with configurations of the other above-described embodiments. All aspects included in the technical concept identified solely by the words recited in the claims are embodiments of the present disclosure.

The invention claimed is:

1. An electric powered work machine, comprising:
   a motor;
   a manually-operated switch configured to be turned ON/OFF by a user of the electric powered work machine to drive/stop the motor;
   a grip configured to be gripped by a hand of the user;
   a current-carrying path to the motor;
   a switching circuit including a first semiconductor device, the first semiconductor device being provided on the current-carrying path and configured to control a conducted state of the motor;
   a circuit board including the switching circuit and a portion of the current-carrying path;
   a metal case fixed to the circuit board; and
   a heat radiation sheet abutting on the circuit board and the metal case;
   the circuit board including:
      a first surface including the switching circuit,
      a second surface abutting on the heat radiation sheet,
      a board conductive line including a conductive material, and
      a circuit arrangement area including the switching circuit and two or more first through holes, the two or more first through holes penetrating from the first surface to the second surface,
   the board conductive line including at least the portion of the current-carrying path and electrically connected to the switching circuit,
   the board conductive line including:
      a first conductive line portion arranged on the first surface,
      a second conductive line portion arranged on the second surface, and
      two or more third conductive line portions arranged on respective inner surfaces of the first through holes,
   the first conductive line portion being electrically connected to the second conductive line portion via the two or more third conductive line portions.

2. The electric powered work machine according to claim 1, wherein the circuit board includes two or more fillers that: (i) contain electrical insulating material and (ii) are arranged in respective interiors of the two or more first through holes.

3. The electric powered work machine according to claim 1, further comprising
two or more fillers arranged in respective interiors of the two or more first through holes.

4. The electric powered work machine according to claim 1,
wherein the switching circuit further includes a second semiconductor device provided on the current-carrying path and configured to control the conducted state,
wherein the board conductive line includes a first coupling portion electrically connected to the first semiconductor device, to the second semiconductor device, and to the motor, and
wherein the first semiconductor device and the second semiconductor device are disposed such that the first coupling portion is arranged therebetween, as seen from a direction perpendicular to the first surface of the circuit board.

5. The electric powered work machine according to claim 4,
wherein the metal case includes a board-facing-surface facing the second surface of the circuit board,
wherein the board-facing-surface includes a facing protruding portion projecting toward the circuit board, and
wherein the heat radiation sheet abuts on the circuit board and the facing protruding portion.

6. The electric powered work machine according to claim 5,
wherein the facing protruding portion includes:
a first protruding portion projecting toward the first semiconductor device; and
a second protruding portion projecting toward the second semiconductor device, and
wherein the heat radiation sheet includes:
a first sheet arranged between the first semiconductor device and the first protruding portion, and
a second sheet arranged between the second semiconductor device and the second protruding portion.

7. The electric powered work machine according to claim 4,
wherein the switching circuit further includes:
a third semiconductor device provided on the current-carrying path and configured to control the conducted state of the motor, and
a fourth semiconductor device provided on the current-carrying path and configured to control the conducted state of the motor,
wherein the board conductive line includes a second coupling portion electrically connected to the third semiconductor device, to the fourth semiconductor device, and to the motor,
wherein the third semiconductor device and the fourth semiconductor device are arranged such that the second coupling portion is arranged therebetween, as seen from the direction perpendicular to the first surface of the circuit board,
wherein the circuit board includes a first connection arrangement area and a second connection arrangement area adjacent to each other,
wherein the first connection arrangement area is provided with the first semiconductor device, the first coupling portion, and the second semiconductor device arranged thereon, and
wherein the second connection arrangement area is provided with the third semiconductor device, the second coupling portion, and the fourth semiconductor device arranged thereon.

8. The electric powered work machine according to claim 1,
wherein the circuit board further includes a device adjacent area including two or more second through holes, the device adjacent area being adjacent to the circuit arrangement area, the two or more second through holes penetrating from the first surface to the second surface,
wherein the board conductive line includes two or more fourth conductive line portions arranged on respective inner surfaces of the two or more second through holes, and
wherein the first conductive line portion is electrically connected to the second conductive line portion via the two or more fourth conductive line portions.

9. The electric powered work machine according to claim 8,
wherein the two or more second through holes are arranged in a portion of the device adjacent area.

10. A method of manufacturing an electric powered work machine, the method comprising:
forming two or more first through holes on a circuit board, the circuit board including a first surface and a second surface, and the two or more first through holes extending from the first surface to the second surface;
providing a first surface conductive line on the first surface;
providing a second surface conductive line on the second surface;
arranging two or more through conductive lines on respective inner surfaces of the two or more first through holes;
electrically connecting the first surface conductive line and the second surface conductive line via the two or more through conductive lines;
providing a semiconductor device on the first surface, the semiconductor device being configured to control a conducted state of a motor of the electric powered work machine;
electrically connecting the semiconductor device to the first surface conductive line;
bringing a radiation sheet into contact with the second surface; and
mounting a metal case on the circuit board with the metal case being in contact with the radiation sheet.

11. The method according to claim 10, further comprising
providing two or more fillers in respective interiors of the two or more first through holes, the two or more fillers containing electrical insulating material.

* * * * *